United States Patent
Nogami et al.

[11] Patent Number: 6,083,817
[45] Date of Patent: Jul. 4, 2000

[54] COBALT SILICIDATION USING TUNGSTEN NITRIDE CAPPING LAYER

[75] Inventors: Takeshi Nogami, Kanagawa, Japan; Robert Chen, Los Altos; Guarionex Morales, Santa Clara, both of Calif.

[73] Assignee: Advanced Micro Devices, Inc., Sunnyvale, Calif.

[21] Appl. No.: 09/323,818

[22] Filed: Jun. 2, 1999

[51] Int. Cl.[7] .............................................. H01L 21/3205
[52] U.S. Cl. .................. 438/586; 438/592; 438/649; 438/683; 438/902
[58] Field of Search ................... 438/586, 592, 438/649, 655, 656, 664, 682, 683, 902; 257/384, 413, 769

[56] References Cited

U.S. PATENT DOCUMENTS

| | | | |
|---|---|---|---|
| 5,550,084 | 8/1996 | Anjum et al. ............................ | 438/684 |
| 5,736,461 | 4/1998 | Berti et al. ............................... | 438/651 |
| 5,780,362 | 7/1998 | Wang et al. .............................. | 438/683 |
| 5,911,114 | 6/1999 | Naem ........................................ | 438/684 |
| 5,973,300 | 8/1999 | Sekine et al. ............................. | 438/300 |

*Primary Examiner*—T. N. Quach

[57] ABSTRACT

A substantially inert capping layer of tungsten nitride is deposited on cobalt layers prior to silicidation, thereby avoiding any substantial interaction with cobalt. The tungsten nitride capping layer also functions as a diffusion barrier preventing oxygen from reaching the silicidation area. The resulting cobalt silicides layer exhibit lower resistivity than those formed employing a titanium capping layer. Embodiments include rapid thermal annealing to initially form a layer of cobalt monosilicide consuming a portion of the cobalt layer, removing the tungsten nitride and unreacted cobalt layer, and rapid thermal annealing again to convert the cobalt monosilicide layer to a low resistivity layer of cobalt disilicide.

18 Claims, 2 Drawing Sheets

COBALT SILICIDATION USING TUNGSTEN NITRIDE CAPPING LAYER

TECHNICAL FIELD

The present invention relates to a method of manufacturing a semiconductor device comprising low resistance cobalt disilicide films. The invention has particular applicability in manufacturing ultra-large scale integration and high density semiconductor devices with submicron design features.

BACKGROUND ART

The escalating requirements for high densification and performance associated with ultra-large scale integration semiconductor devices requires design features of 0.25 microns and under, increased transistor and circuit speeds, high reliability and increased manufacturing throughput. Such requirements have been found difficult to satisfy in terms of providing low RC (Resistance Capacitance) interconnect patterns. Moreover, as design features are reduced to about 0.25 microns and under, processing defects which were either not apparent or of little impact on device performance become apparent and/or adversely impact device performance, thereby generating an unacceptable rejection rate.

Conventional semiconductor manufacturing methodology comprises forming low resistance cobalt disilicide ($CoSi_2$) layers at electrical interconnection points, such as on polycrystalline silicon gate electrodes and/or source/drain regions formed in a silicon semiconductor substrate. Typically, a layer of cobalt is deposited, as by physical vapor deposition (PVD) on the gate electrode and/or source/drain regions. A capping layer containing titanium is then deposited on the cobalt layers to prevent oxygen in the atmosphere from diffusing into the cobalt disilicide layer during the silicidation reaction, thereby preventing an undesirable increase in resistivity. Annealing is then conducted at an elevated temperature during which silicidation occurs, i.e., cobalt reacts with the underlying silicon to form a $CoSi_2$ low resistivity layer. The titanium-containing capping layer is then removed.

It was found, however, that titanium from the capping layer undesirably reacts with cobalt in the underlying layer and diffuses into the silicide layer forming a mixed layer of titanium disilicide ($TiSi_2$) and $CoSi_2$ having an undesirable high resistivity. In addition, it was found extremely difficult to selectively remove the titanium-containing capping layer without adversely impacting the underlying silicide layer.

Accordingly, there exists a need for semiconductor methodology to form low resistivity $CoSi_2$ layers, particularly in manufacturing ultra-large scale integration and high density semiconductor devices with submicron design features, e.g., 0.25 microns and under.

DISCLOSURE OF THE INVENTION

An object of the present invention is a method of manufacturing a semiconductor device having submicron features with low resistivity $CoSi_2$ films on silicon layers.

Additional objects and advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out to the appended claims.

According to the present invention, the foregoing and other objects are achieved in part by a method of manufacturing a semiconductor device, the method comprising: forming a substantially cobalt layer on a silicon layer and/or silicon substrate; forming a substantially tungsten nitride layer on each cobalt layer ; annealing while the tungsten nitride layer is on each cobalt layer, to react cobalt in the cobalt layer with the underlying silicon to form a layer of cobalt silicide on the silicon layer and/or substrate.

Another aspect of the present invention is a method of manufacturing a semiconductor device, the method comprising: depositing a substantially cobalt layer on a gate electrode comprising silicon and/or on source/drain regions in a semiconductor substrate comprising silicon, at a thickness of about 50 Å to about 250 Å; depositing a substantially tungsten nitride layer on each cobalt layer at a thickness of about 300 Å to about 1500 Å; annealing, while the tungsten nitride is on each cobalt layer, at a temperature of about 450° C. to about 600° C. to form a substantially cobalt monosilicide (CoSi) layer at a thickness of about 200 Å to about 400 Å consuming about 2% to about 10% by weight of the cobalt in the cobalt layer, leaving a layer of unreacted cobalt; removing the tungsten nitride layer; removing the layer of unreacted cobalt; and annealing at temperature of about 700° C. to about 900° C. to convert the layer of CoSi to a layer of cobalt disilicide ($CoSi_2$) having a thickness of about 200 Å to about 900 Å.

Additional objects and advantages of the present invention will become readily apparent to those skilled in this art from the following detailed description, wherein only the preferred embodiment of the invention is shown and described simply by way of illustration of the best mode contemplated for carrying out the invention. As will be realized, the invention is capable of other and different embodiments, and its several details are capable of modifications in various obvious respects, all without departing from the invention. Accordingly, the description is to be regarded as a illustrative in nature and not as restrictive.

DESCRIPTION OF THE INVENTION

Figure 1:
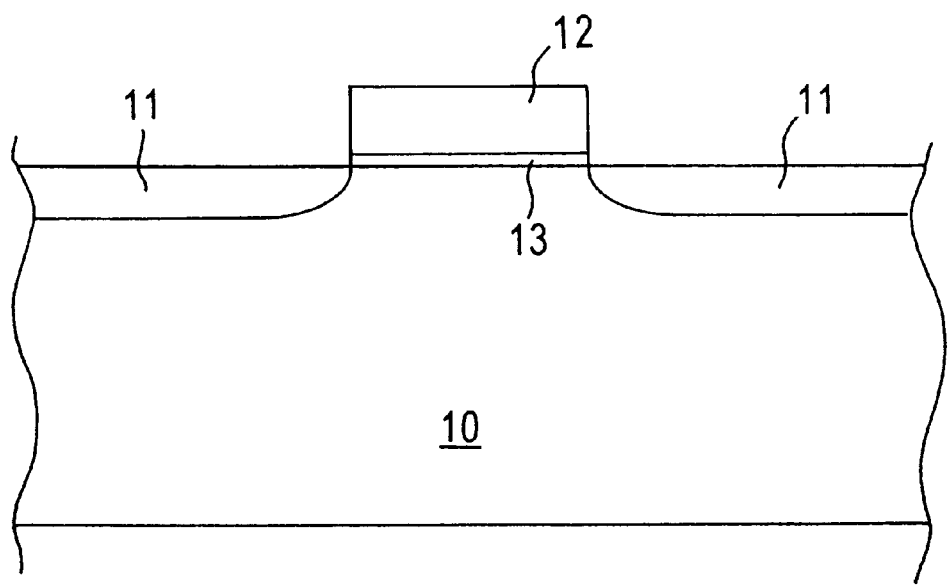
FIGS. 1–4 schematically illustrate sequential phases of a method in accordance with an embodiment of the present invention.

The present invention addresses and solves problems attendant upon conventional semiconductor manufacturing methodology in forming $CoSi_2$ layers employing a capping layer comprising titanium, such as a capping layer of substantially titanium or a titanium alloy. It was found that titanium in the capping layer undesirably reacts with cobalt in the underlying cobalt layer and diffuses into the silicon layer, thereby resulting in a silicide layer comprising both $CoSi_2$ and $TiSi_2$ having an undesirably high resistivity. In addition, it is extremely difficult to selectively remove the titanium-containing capping layer without adversely impacting the underlying silicide layer.

The present invention addresses and solves such problems by employing a tungsten nitride (WN) capping layer. It was found that during silicidation annealing of the cobalt layer to form cobalt silicide, the WN layer is substantially inert to the silicidation reaction, in that there is substantially no interaction between tungsten and cobalt or between tungsten and cobalt silicide. Moreover, it was found that the WN layer advantageously functions as a diffusion barrier against oxygen diffusing from the annealing ambient into the silicidation region. Consequently, the resulting $CoSi_2$ layer exhibits a lower resistivity than $CoSi_2$ layers formed by conventional methods employing a titanium-containing capping layer during the silicidation reaction. It was also found that subsequent to silicidation, the WN capping layer can be easily selectively stripped employing a hydrogen peroxide solution.

Embodiments of the present invention include depositing the cobalt layer on a polycrystalline silicon gate electrode and/or source/drain regions in a silicon semiconductor substrate by PVD. The cobalt layer can be deposited at a suitable thickness for forming the low resistivity cobalt $CoSi_2$ layer, such as at about 50 Å to about 250 Å, e.g., about 100 Å to about 200 Å. The WN layer can be advantageously be deposited by PVD or chemical vapor deposition (CVD) on each cobalt layer at a thickness of about 300 Å to about 1500 Å, e.g., about 700 Å to about 1200 Å. The $CoSi_2$ layers formed in accordance with embodiments of the present invention typically exhibit a resistivity of about 15 to about 18 micro ohms per centimeter; whereas, $CoSi_2$ layers formed in accordance with conventional practices employing a titanium-containing capping layer typically have a higher resistivity of about 18 to about 20 micro ohms per centimeter.

Embodiments of the present invention comprise depositing the WN layer and then conducting an initial rapid thermal annealing to convert a portion of the deposited cobalt layer e.g., about 2 to about 10 weight percent, into a cobalt monosilicide (CoSi) layer. Such an initial rapid thermal annealing can be conducted for about 1 minute at a temperature of about 450° C. to about 600° C. in an atmosphere containing an inert gas and/or nitrogen, thereby resulting in a CoSi layer having a thickness of about 200 Å to about 400 Å. Subsequently, the layer of WN is selectively removed, as by employing a mixture of hydrogen peroxide, ammonium hydroxide and deionized water, at a volume ratio of about 1:1:5. After selective removal of the WN layer, the remaining unreacted layer of cobalt is removed, as by employing a mixture of hydrogen peroxide and sulfuric acid having concentrations of about 1% and 6.8%, respectively. Subsequently, a second rapid thermal annealing is conducted to convert the high resistivity CoSi layer into a low resistivity $CoSi_2$ layer. The second rapid thermal annealing to form $CoSi_2$ can be conducted at a temperature of about 700° C. to about 900° C. for up to about 1 minute in an atmosphere containing an inert gas and/or nitrogen. Typically, the resulting layer of $CoSi_2$ has thickness of about 200 Å to about 900 Å, e.g., about 350 Å to about 700 Å.

An embodiment of the present invention is schematically illustrated in FIGS. 1–4, wherein similar features bear similar reference numerals. Adverting to FIG. 1, a transistor portion of a semiconductor device is schematically illustrated and comprises substrate 10, typically of doped monocrystalline silicon, with source/drain regions 11 formed in a main surface thereof spaced apart to define a channel region. Gate electrode 12, typically doped polycrystalline silicon, is formed above the channel region with a gate oxide layer 13 therebetween.

Figure 2:
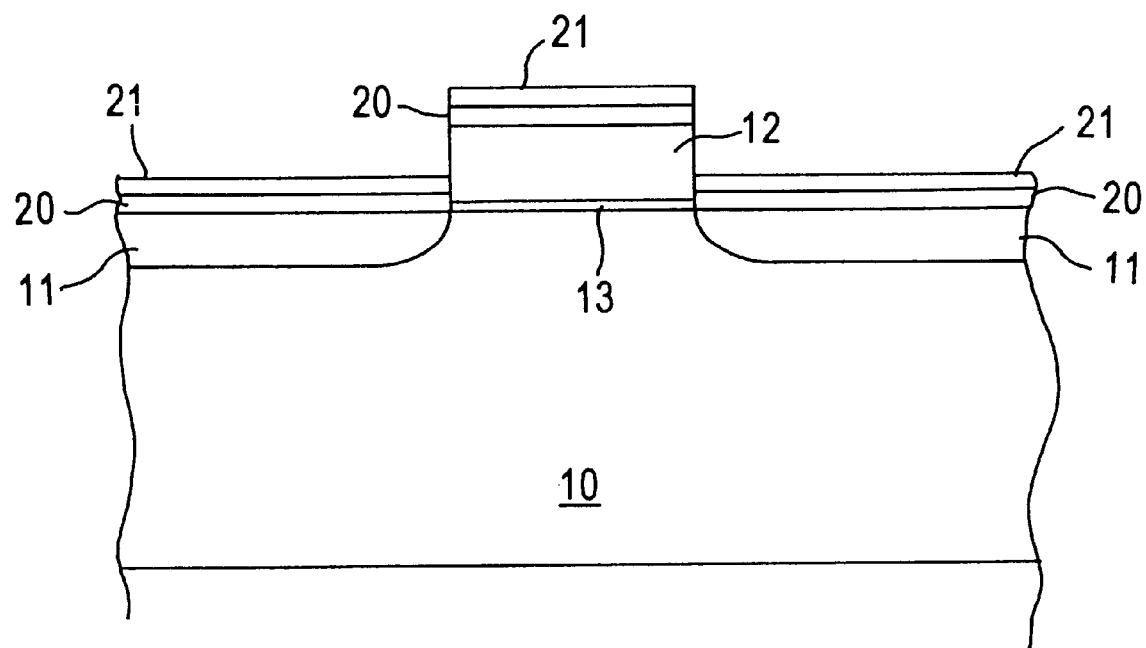

Adverting to FIG. 2, cobalt layer 20 is deposited on source/drain regions 11 and gate electrode 12, as by PVD, at a thickness of about 50 Å to about 250 Å, e.g., 100 Å to about 200 Å. A WN layer 21 is then deposited on each cobalt layer 20, as by PVD or CVD, at a thickness of about 300 Å to about 1500 Å, e.g., about 700 Å to about 1200 Å.

Figure 3:
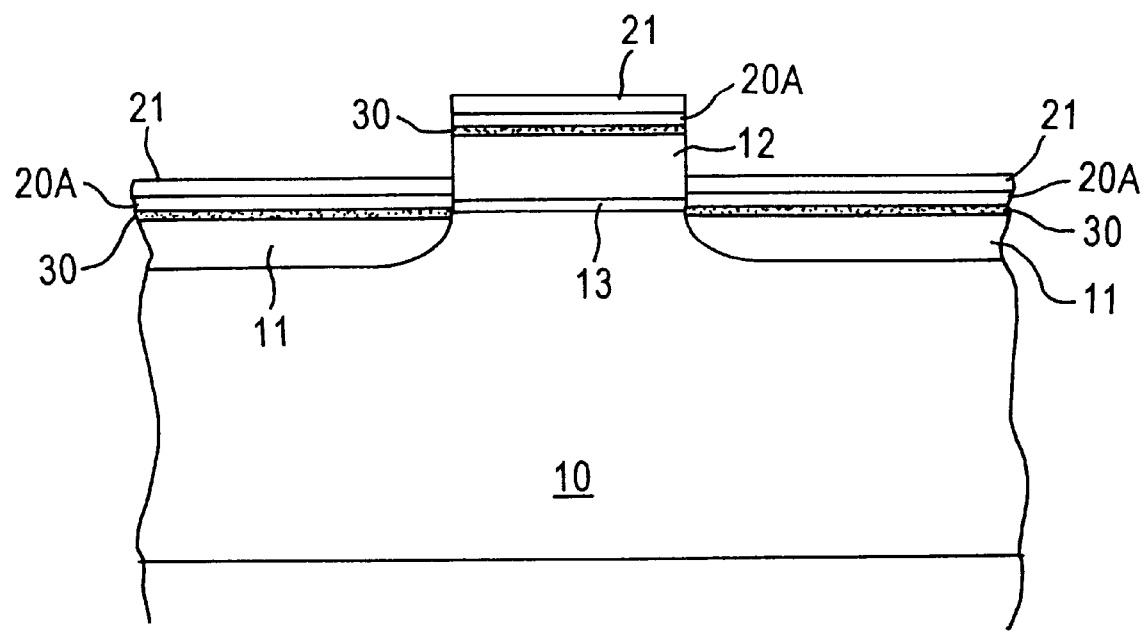

With reference to FIG. 3, an initial rapid thermal annealing is then conducted, as at a temperature of about 450° C. to about 600° C., to form a CoSi layer 30, consuming up to about 10% by weight of cobalt layer 20 (FIG. 2) leaving a layer 20A of unreacted cobalt. Subsequently, WN layer 21 is removed, typically employing a mixture of hydrogen peroxide, ammonium hydroxide and deionized water. After removing, the WN layer, unreacted cobalt layer 20A is removed, as by employing mixture of hydrogen peroxide (1% concentration) and sulfuric acid (6.8% concentration).

Figure 4:
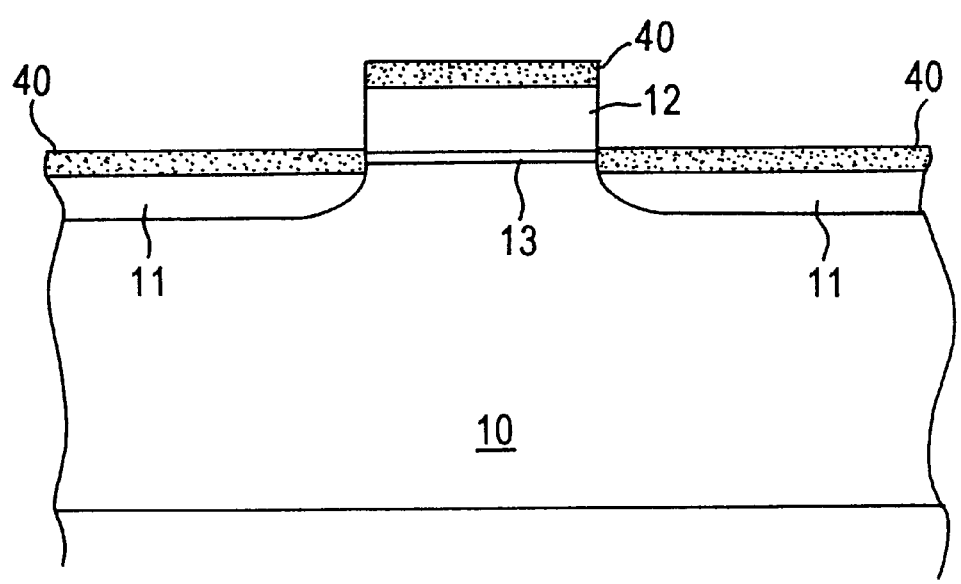

After removing WN layer 21 and unreacted cobalt layer 20A, a second rapid thermal annealing is conducted, as at a temperature of about 700° C. to about 900° C., to convert high resistivity CoSi layer 30 into low resistivity $CoSi_2$ layer 40, as shown in FIG. 4. Low resistivity $CoSi_2$ layer typically has a thickness of 300 Å to about 1500 Å, e.g., 700 Å to about 1200 Å.

The methodology of the present invention employing a WN capping layer enables the formation of relatively low resistivity $CoSi_2$ layers having a resistivity of about 15 to about 18 micro ohms per centimeter without encountering the disadvantages attended upon conventional practices employing a titanium-containing capping layer, which results in $CoSi_2$ layers having an undesirably high resistivity of about 18 to about 20 micro ohms per centimeter. Moreover, the use of a WN capping layer in accordance with embodiments of the present invention avoids any substantial interaction with the underlying cobalt or silicon layer, as occurs when employing a conventional titanium-containing capping layer, and further prevents the diffusion of any oxygen from the annealing ambient into the silicidation region. In embodiments of the present invention, the WN capping layer can be selectively and easily stripped employing a hydrogen peroxide solution.

The present invention enjoys utility in manufacturing of various types of the semiconductor devices, particularly high density, multi-metal patterned layers with submicron features, particularly submicron features of 0.25 microns and below. Semiconductor devices produced in accordance with the present invention exhibit high speed characteristics and improved reliability.

In the previous descriptions, numerous specific details are set forth in order to provide a through understanding of the present invention. However, the invention can be practiced without resorting to the details specifically set forth. In other instances, well known processing structures have not been described in detail in order not to unnecessarily obscure the present invention.

Only the preferred embodiment of the present invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, the method comprising:

forming a substantially cobalt layer on a silicon layer and/or silicon substrate;

forming a substantially tungsten nitride layer on each cobalt layer;

annealing, while the tungsten nitride layer is on each cobalt layer, to react cobalt in the cobalt layer with the underlying silicon to form a layer of cobalt silicide on the silicon layer and/or substrate.

2. The method according to claim 1, further comprising removing the layer of tungsten nitride.

3. The method according to claim 1, comprising sequentially:

annealing, while the tungsten nitride layer is on each cobalt layer, to react cobalt with silicon to form a substantially cobalt monosilicide CoSi layer;

removing the tungsten nitride layer and any unreacted cobalt; and annealing to substantially convert the CoSi layer to a substantially cobalt disilicide $CoSi_2$ layer.

4. The method according to claim 3, comprising:

annealing to form the CoSi layer at a temperature of about 450° C. to about 600° C. for up to about 1 minute in an atmosphere containing an inert gas and/or nitrogen; and annealing to form the $CoSi_2$ layer at a temperature of about 700° C. to about 900° C. for up to about 1 minute in an atmosphere comprising an inert gas and/or nitrogen.

5. The method according to claim 4, comprising:

annealing to form the CoSi layer at a thickness of about 200 Å to about 400 Å consuming about 2 to about 10 percent by weight of the cobalt in the cobalt layer leaving a layer of unreacted cobalt; and removing the tungsten nitride and the layer of unreacted cobalt using hydrogen peroxide.

6. The method according to claim 5, comprising sequentially;

initially removing the tungsten nitride layer using a mixture of hydrogen peroxide, ammonium hydroxide and deionized water; and removing the unreacted cobalt layer using a mixture of hydrogen peroxide and sulfuric acid.

7. The method according to claim 5, wherein the $CoSi_2$ layer has a thickness of about 200 Å to about 900 Å.

8. The method according to claim 7, wherein the $CoSi_2$ layer has a thickness of about 350 Å to about 700 Å.

9. The method according to claim 1, comprising depositing the cobalt layer on a gate electrode and/or on source/drain regions formed in a semiconductor substrate.

10. The method according to claim 1, comprising depositing the tungsten nitride layer by physical vapor deposition or chemical vapor deposition.

11. The method according to claim 10, comprising depositing the tungsten nitride layer at a thickness of about 300 Å to about 1500 Å.

12. The method according to claim 11, comprising depositing the tungsten nitride layer at a thickness of about 700 Å to about 1200 Å.

13. The method according to claim 1, comprising depositing the cobalt layer by physical vapor deposition.

14. The method according to claim 13, comprising depositing the cobalt layer at a thickness of about 50 Å to about 250 Å.

15. The method according to claim 14, comprising depositing the cobalt layer at a thickness of about 100 Å to about 200 Å.

16. A method of manufacturing a semiconductor device, the method comprising:

depositing a substantially cobalt layer on a gate electrode comprising silicon and/or on source/drain regions in a semiconductor substrate comprising silicon, at a thickness of about 50 Å to about 250 Å;

depositing a substantially tungsten nitride layer on each cobalt layer at a thickness of about 300 Å to about 1500 Å;

annealing, while the tungsten nitride layer is on each cobalt layer, at a temperature of about 450° C. to about 600° C. to form a substantially cobalt monosilicide (CoSi) layer at a thickness of about 200 Å to about 400 Å consuming about 2% to about 10% by weight of the cobalt in the cobalt layer, leaving a layer of unreacted cobalt;

removing the tungsten nitride layer;

removing the layer of unreacted cobalt; and annealing at a temperature of about 700° C. to about 900° C. to convert the CoSi layer to a substantially cobalt disilicide ($CoSi_2$) layer having a thickness of about 200 Å to about 900 Å.

17. The method according to claim 16 comprising:

depositing the cobalt layer at a thickness of about 100 Å to about 200 Å;

depositing the tungsten nitride layer at a thickness of about 700 Å to about 1200 Å;

annealing to form the CoSi layer up to about 1 minute in an atmosphere containing an inert gas and/or nitrogen; and annealing to form the CoSi layer having a thickness of about 350 Å to about 700 Å up to about 1 minute in an atmosphere comprising an inert gas and/or nitrogen.

18. The method according to claim 17 comprising:

removing the layer of tungsten nitride using a mixture of hydrogen peroxide, ammonium hydroxide and deionize water; and removing the layer of unreacted cobalt using a mixture of hydrogen peroxide and sulfuric acid.

* * * * *